(12) United States Patent
Li (10) Patent No.: US 12,205,883 B2
(45) Date of Patent: Jan. 21, 2025

(54) SEMICONDUCTOR STRUCTURE AND FABRICATION METHOD THEREOF

(71) Applicants: Semiconductor Manufacturing International (Shanghai) Corporation, Shanghai (CN); Semiconductor Manufacturing International (Beijing) Corporation, Beijing (CN)

(72) Inventor: Zhi Lin Li, Shanghai (CN)

(73) Assignees: Semiconductor Manufacturing International (Shanghai) Corporation, Shanghai (CN); Semiconductor Manufacturing International (Beijing) Corporation, Beijing (CN)

( * ) Notice: Subject to any disclaimer, the term of this patent is extended or adjusted under 35 U.S.C. 154(b) by 303 days.

(21) Appl. No.: 17/205,761

(22) Filed: Mar. 18, 2021

(65) Prior Publication Data
US 2021/0313260 A1 Oct. 7, 2021

(30) Foreign Application Priority Data
Apr. 1, 2020 (CN) .......................... 202010252539.1

(51) Int. Cl.
*H01L 23/522* (2006.01)
*H01L 21/768* (2006.01)
(Continued)

(52) U.S. Cl.
CPC ........ *H01L 23/5222* (2013.01); *H01L 21/768* (2013.01); *H01L 23/528* (2013.01); *H01L 24/13* (2013.01)

(58) Field of Classification Search
CPC ..... H01L 23/5222; H01L 23/528–5283; H01L 23/5226; H01L 27/0207; H01L 23/5221
See application file for complete search history.

(56) References Cited

U.S. PATENT DOCUMENTS

5,471,093 A * 11/1995 Cheung ............... H01L 23/5222
257/776
6,288,447 B1 * 9/2001 Amishiro ............ H01L 23/5222
257/E23.152
(Continued)

*Primary Examiner* — Younes Boulghassoul
*Assistant Examiner* — Quinton A Brasfield
(74) *Attorney, Agent, or Firm* — Anova Law Group, PLLC (57) ABSTRACT

A semiconductor structure and a method for forming the semiconductor structure are provided. The semiconductor structure includes a substrate structure including a device region, a first interconnection structure, and a plurality of third interconnection layers. The device region includes a plurality of first regions and one or more second regions that are arranged along a first direction. The first interconnection structure includes a plurality of first interconnection layers and a plurality of second interconnection layers that are extended along a second direction. A first interconnection layer has a length greater than a second interconnection layer in the second direction, and the first direction is perpendicular to the second direction. A third interconnection layer is disposed over the second region, and the third interconnection layer is electrically interconnected with the second interconnection layer. The third interconnection layer has a length greater than the second interconnection layer in the second direction.

18 Claims, 6 Drawing Sheets

(51) Int. Cl.
*H01L 23/00* (2006.01)
*H01L 23/528* (2006.01)

(56) References Cited

U.S. PATENT DOCUMENTS

| | | | |
|---|---|---|---|
| 2017/0317027 A1* | 11/2017 | Chen | H01L 21/823431 |
| 2021/0192118 A1* | 6/2021 | Lei | G06F 30/398 |
| 2021/0320065 A1* | 10/2021 | Date | H01L 27/092 |

* cited by examiner

SEMICONDUCTOR STRUCTURE AND FABRICATION METHOD THEREOF

CROSS-REFERENCES TO RELATED APPLICATIONS

This application claims the priority of Chinese patent application No. 202010252539.1, filed on Apr. 1, 2020, the entirety of which is incorporated herein by reference.

FIELD OF THE DISCLOSURE

The present disclosure generally relates to the field of semiconductor manufacturing technology and, more particularly, relates to a semiconductor structure and a fabrication method thereof.

BACKGROUND

With the continuous progress of semiconductor integrated circuit manufacturing technology, the continuous improvement of performance is also accompanied by the process of miniaturization of devices. More and more advanced manufacturing processes require the realization of as many devices as possible in a substantially small area.

In an ultra-large-scale integrated circuit, the use of a metal interconnection layer is one of methods for achieving electrical interconnection between devices. However, performance of the existing semiconductor structure is still poor. The disclosed methods and device structures are directed to solve one or more problems set forth above and other problems.

BRIEF SUMMARY OF THE DISCLOSURE

One aspect of the present disclosure includes a semiconductor structure. The semiconductor structure includes a substrate structure including a device region. The device region includes a plurality of first regions and one or more second regions. A second region of the one or more second regions is disposed between adjacent first regions of the plurality of first regions, and the plurality of first regions and the one or more second regions are arranged along a first direction. The semiconductor structure also includes a first interconnection structure disposed over the device region and electrically interconnected with a circuit of the device region. The first interconnection structure includes a plurality of first interconnection layers and a plurality of second interconnection layers that are extended along a second direction. A first interconnection layer of the plurality of first interconnection layers is disposed over a first region of the plurality of first regions, and a second interconnection layer of the plurality of second interconnection layers is disposed over the second region. The first interconnection layer has a length greater than the second interconnection layer in the second direction, and the first direction is perpendicular to the second direction. Further, the semiconductor structure includes a plurality of third interconnection layers disposed over the first interconnection structure. A third interconnection layer of the plurality of third interconnection layers is disposed over the second region, and the third interconnection layer is electrically interconnected with the second interconnection layer. The third interconnection layer has a length greater than the second interconnection layer in the second direction.

Optionally, the semiconductor structure further includes a dielectric layer surrounding the first interconnection structure and the third interconnection layer.

Optionally, in the second direction, a minimum length of the second interconnection layer is approximately 100 nm.

Optionally, in the second direction, the third interconnection layer has a length equal to the first interconnection layer.

Optionally, in a direction perpendicular to a surface of the substrate structure, a minimum distance between a top surface of the first interconnection structure and a bottom surface of the third interconnection layer is in a range of approximately 400 nm-500 nm.

Optionally, one of the plurality of first interconnection layers is disposed over one of the plurality of first regions, and one of the plurality of second interconnection layers is disposed over one of the one or more second regions.

Optionally, in the first direction, a minimum distance between a first interconnection layer and a second interconnection layer adjacent to the first interconnection layer is approximately 20 nm.

Optionally, two or more of the plurality of first interconnection layers are disposed over one of the plurality of first regions, and one of the plurality of second interconnection layers is disposed over one of the one or more second regions.

Optionally, two or more of the plurality of first interconnection layers are disposed over one of the plurality of first regions, and two or more of the plurality of second interconnection layers are disposed over one of the one or more second regions.

Optionally, the semiconductor structure further includes a fourth interconnection layer disposed between the second interconnection layer and the third interconnection layer. The fourth interconnection layer is extended along the first direction and is across all of the plurality of second interconnection layers, and the fourth interconnection layer is electrically interconnected with the second interconnection layer and the third interconnection layer, respectively.

Optionally, the semiconductor structure further includes a plurality of first conductive plugs. One of the plurality of first conductive plugs is disposed between the fourth interconnection layer and one of the plurality of second interconnection layers, and the one first conductive plug is electrically interconnected with the fourth interconnection layer and the one second interconnection layer, respectively.

Optionally, the semiconductor structure further includes a plurality of second conductive plugs. Each of the plurality of second conductive plugs is disposed between the fourth interconnection layer and one of the plurality of third interconnection layers, and the each second conductive plug is electrically interconnected with the fourth interconnection layer and the one third interconnection layer, respectively.

Optionally, the first interconnection layer is made of a material including a metal material, the second interconnection layer is made of a material including a metal material, and the third interconnection layer is made of a material including a metal material.

Optionally, the dielectric layer is made of a material including silicon nitride, silicon oxide, silicon oxynitride, silicon oxycarbide, silicon carbonitride, silicon oxy-carbonitride, or a combination thereof.

Optionally, the device region of the substrate structure further includes a plurality of fin structures discrete from each other, and a gate structure on a surface of a fin structure of the plurality of fin structures. The fin structure is extended along the first direction or the second direction.

Optionally, the device region of the substrate structure further includes a fifth interconnection layer and a sixth interconnection layer. The fifth interconnection layer is electrically interconnected with the circuit of the device region and the first interconnection layer, respectively. The sixth interconnection layer is electrically interconnected with the circuit of the device region and the second interconnection layer, respectively.

Another aspect of the present disclosure includes a method for forming a semiconductor structure. The method includes providing a substrate structure. The substrate structure includes a device region, and the device region includes a plurality of first regions and one or more second regions. A second region of the one or more second regions is disposed between adjacent first regions of the plurality of first regions, and the plurality of first regions and the one or more second regions are arranged along a first direction. The method also includes forming a first interconnection structure over the device region. The first interconnection structure is electrically interconnected with a circuit of the device region, and the first interconnection structure includes a plurality of first interconnection layers and a plurality of second interconnection layers that are extended along a second direction. A first interconnection layer of the plurality of first interconnection layers is disposed over a first region of the plurality of first regions, and a second interconnection layer of the plurality of second interconnection layers is disposed over the second region. The first interconnection layer has a length greater than the second interconnection layer in the second direction, and the first direction is perpendicular to the second direction. Further, the method includes forming a plurality of third interconnection layers over the first interconnection structure. A third interconnection layer of the plurality of third interconnection layers is disposed over the second region, and the third interconnection layer is electrically interconnected with the second interconnection layer. The third interconnection layer has a length greater than the second interconnection layer in the second direction.

Optionally, the method further includes forming a dielectric layer surrounding the first interconnection structure and the third interconnection layer.

Optionally, before forming the plurality of third interconnection layers, the method further includes forming a fourth interconnection layer over the first interconnection structure. The fourth interconnection layer is extended along the first direction and is across all of the plurality of second interconnection layers, and the fourth interconnection layer is electrically interconnected with the second interconnection layer and the third interconnection layer, respectively.

Optionally, the method further includes forming a plurality of first conductive plugs, and forming a plurality of second conductive plugs. One of the plurality of first conductive plugs is disposed between the fourth interconnection layer and one of the plurality of second interconnection layers, and the one first conductive plug is electrically interconnected with the fourth interconnection layer and the one second interconnection layer, respectively. One of the plurality of second conductive plugs is disposed between the fourth interconnection layer and one of the plurality of third interconnection layers, and the one second conductive plug is electrically interconnected with the fourth interconnection layer and the one third interconnection layer, respectively.

The disclosed embodiments may have following beneficial effects. In the disclosed embodiments of the present disclosure, through the first interconnection structure and the third interconnection layer, the parasitic capacitance between the first interconnection layer and the second interconnection layer may be reduced, the parasitic capacitance generated between first interconnection layers formed over the adjacent first regions may be reduced, and the parasitic capacitance between the third interconnection layer and the first interconnection layer may be reduced.

First, the first interconnection layer may be formed over the first region, the second interconnection layer may be formed over the second region, and the length of the first interconnection layer may be greater than the length of the second interconnection layer. Thus, in the first direction, through the second interconnection layer with a substantially small length, the overlapped portion between the second interconnection layer and the first interconnection layer may be substantially small. Therefore, the parasitic capacitance between the adjacent first interconnection layer and the second interconnection layer may be reduced, thereby reducing the RC delay.

Second, the first interconnection layer may be formed over the first region, the second region may be disposed between adjacent first regions, and the spacing between the first interconnection layers formed over the adjacent first regions may increase. Therefore, the parasitic capacitance generated between the first interconnection layers formed over the adjacent first regions may be reduced, thereby reducing the RC delay.

Third, the third interconnection layer electrically interconnected with the second interconnection layer may be formed over the second region, and the spacing between the third interconnection layer and the first interconnection layer may increase. Therefore, the parasitic capacitance between the third interconnection layer and the first interconnection layer may be reduced, thereby reducing the RC delay.

Accordingly, through the first interconnection structure and the third interconnection layer, the parasitic capacitance between the electrical interconnection layers in the semiconductor structure may be reduced, and the RC delay may be reduced, thereby improving the performance of the semiconductor structure.

Other aspects of the present disclosure can be understood by those skilled in the art in light of the description, the claims, and the drawings of the present disclosure.

DETAILED DESCRIPTION

Reference will now be made in detail to exemplary embodiments of the disclosure, which are illustrated in the accompanying drawings. Wherever possible, the same reference numbers will be used throughout the drawings to refer to the same or the alike parts. It should be noted that "surface" in the present disclosure may be used to describe the relative positional relationship in space, and may not be limited to direct contact.

Figure 1:
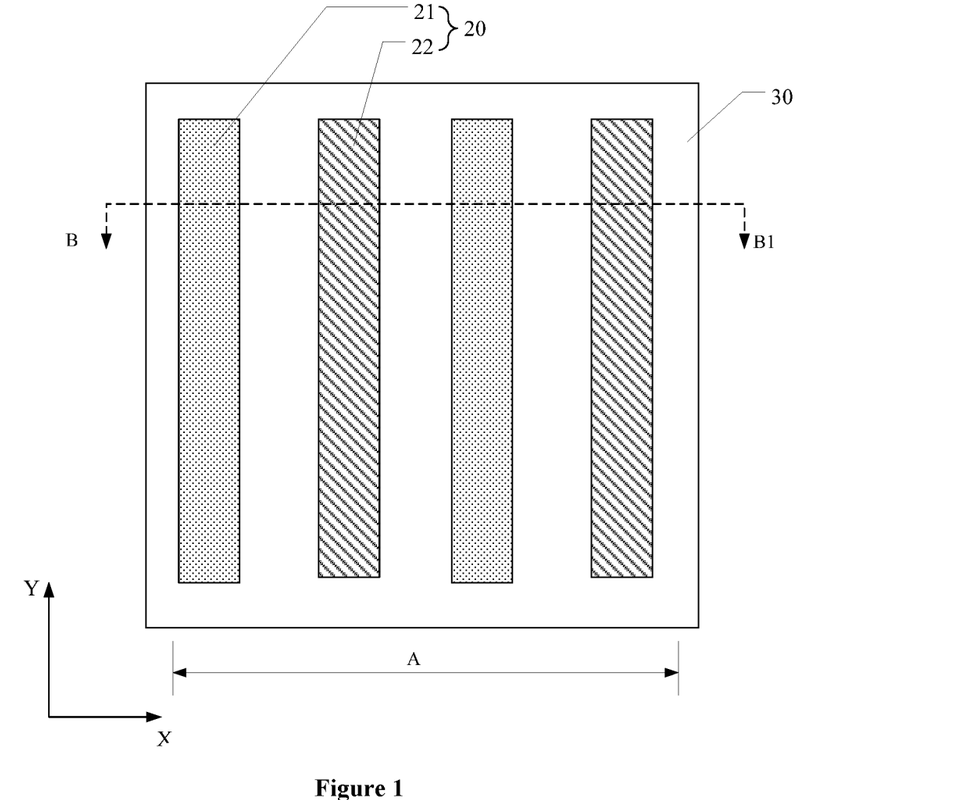
FIGS. 1-2 illustrate semiconductor structures corresponding to certain stages for forming a semiconductor structure.
Figure 2:
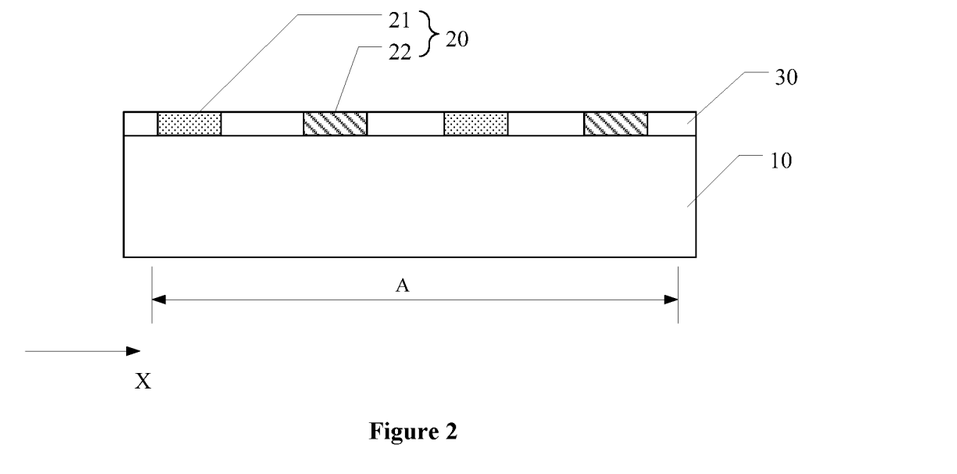

FIGS. 1-2 illustrate semiconductor structures corresponding to certain stages for forming a semiconductor structure.

FIG. 1 illustrates a schematic top view of a semiconductor structure, and FIG. 2 illustrates a schematic BB1-sectional view of the semiconductor structure in FIG. 1. The semiconductor structure includes: a substrate structure 10 including a device region A, a metal interconnection layer 20 formed over the device region A, and a dielectric layer 30 surrounding the metal interconnection layer 20. The metal interconnection layer 20 includes a plurality of first metal interconnection structures 21 discrete from each other and a plurality of second metal interconnection structures 22 discrete from each other, and each of the plurality of second metal interconnection structures 22 is disposed between two adjacent first metal interconnection structures 21. The plurality of first metal interconnection structures 21 and the plurality of second metal interconnection structures 22 are arranged along a first direction X, and a first metal interconnection structure 21 and a second metal interconnection structure 22 are extended along a second direction Y.

However, in the foregoing semiconductor structure, on the one hand, to increase the integration degree of the semiconductor structures, a distance between the first metal interconnection structure 21 and the second metal interconnection structure 22 is substantially small, and on the other hand, to meet the design requirements of the semiconductor structure, in the second direction Y, the first metal interconnection structure 21 has a same length as the second metal interconnection structure 22. Therefore, a substantially large parasitic capacitance is generated between the first metal interconnection structure 21 and the adjacent second metal interconnection structure 22, and RC delay increases, thereby reducing the performance of the semiconductor structure.

To solve the above problems, the present disclosure provides a semiconductor structure. Through forming a second interconnection structure with a substantially small length and forming a second interconnection layer electrically interconnected with the second interconnection structure, the parasitic capacitance between the first interconnection layers and the parasitic capacitance between the second interconnection layer and the first interconnection layer may be reduced, RC delay may be reduced, and the performance of the semiconductor structure may be improved.

Figure 9:
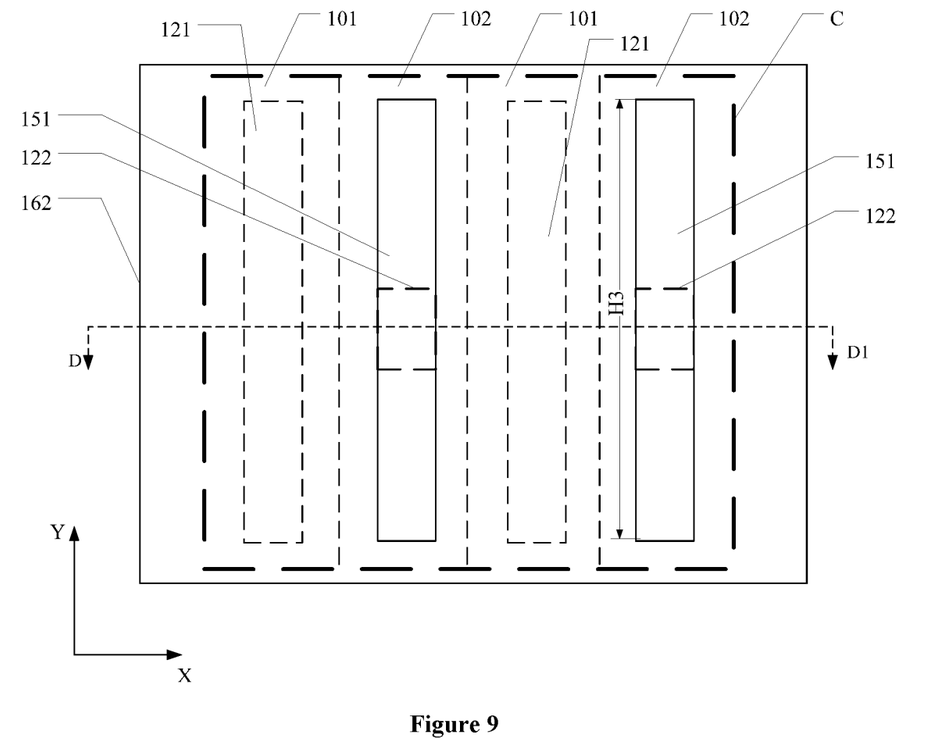
Figure 10:
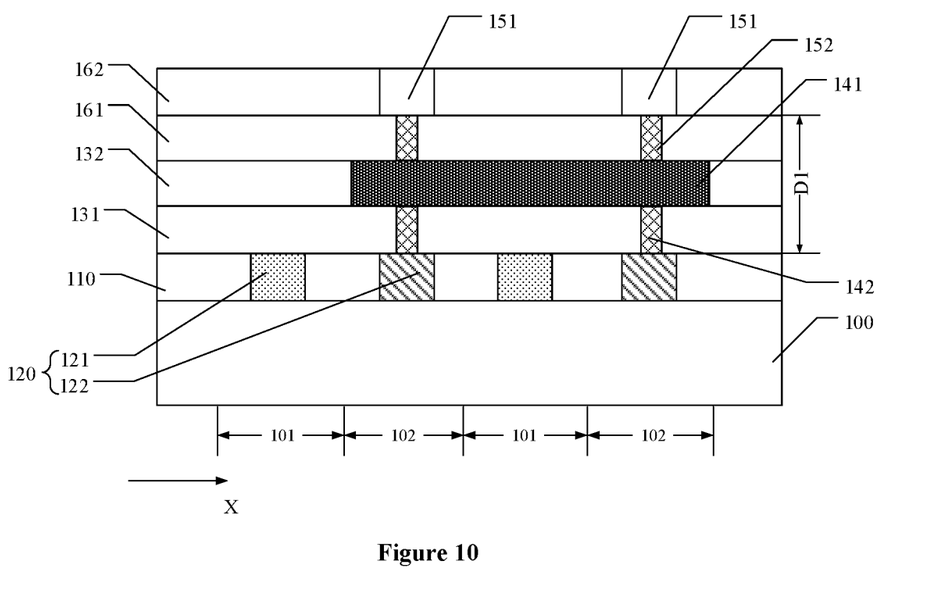
Figure 11:
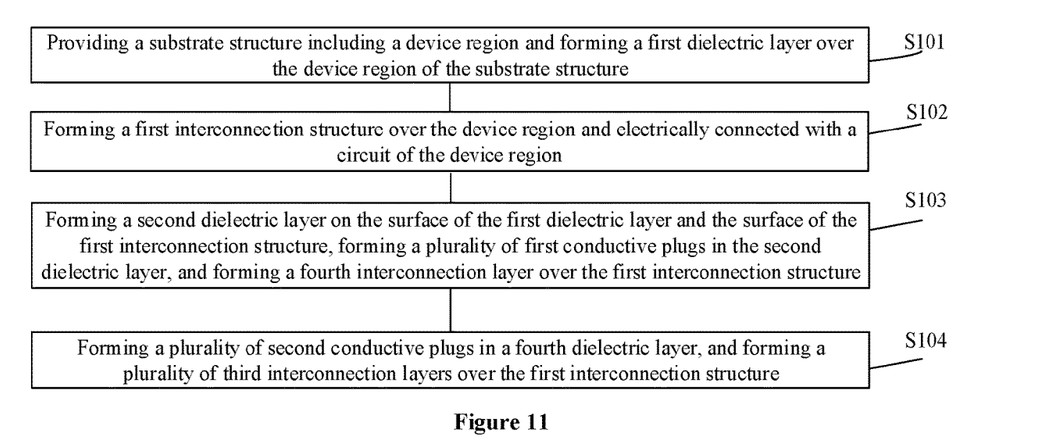
FIG. 11 illustrates a flowchart of an exemplary method for forming a semiconductor structure consistent with various disclosed embodiments of the present disclosure.

FIG. 11 illustrates a flowchart of a method for forming a semiconductor structure consistent with various disclosed embodiments of the present disclosure, and FIGS. 3-10 illustrate semiconductor structures corresponding to certain stages of the fabrication method.

Figure 3:
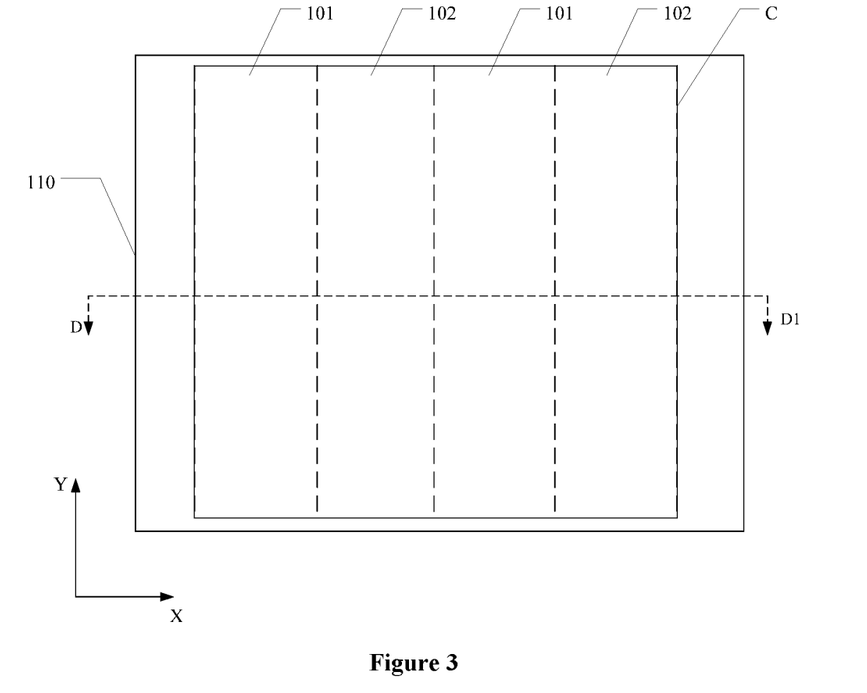
FIGS. 3-10 illustrate semiconductor structures corresponding to certain stages for forming an exemplary semiconductor structure consistent with various disclosed embodiments of the present disclosure.
Figure 4:
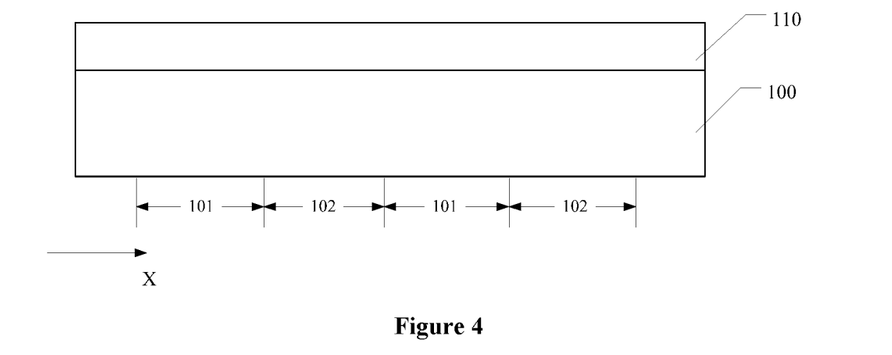

As shown in FIG. 11, at the beginning of the fabrication method, a substrate structure including a device region may be provided and a first dielectric layer may be formed over the device region of the substrate structure (S101). FIGS. 3-4 illustrate a corresponding semiconductor structure.

FIG. 3 illustrates a schematic top view of the semiconductor structure, and FIG. 4 illustrates a schematic D-D1 sectional view of the structure in FIG. 3. Referring to FIG. 3 and FIG. 4, a substrate structure 100 may be provided. The substrate structure 100 may include a device region C, and the device region C may include a plurality of first regions 101, and a second region 102 disposed between adjacent first regions 101. The first region 101 and the second region 102 may be arranged along a first direction X.

The substrate structure 100 may be made of a semiconductor material. In one embodiment, the substrate structure 100 may be made of silicon. In another embodiment, the substrate structure may be made of a material including silicon carbide, silicon germanium, a multi-element semiconductor material composed of group III-V elements, silicon-on-insulator (SOI), or germanium-on-insulator. The multi-element semiconductor material composed of group III-V elements may include InP, GaAs, GaP, InAs, InSb, InGaAs or InGaAsP.

In one embodiment, the device region C of the substrate structure 100 may have a device layer (not illustrated). The device layer may include a device structure, e.g., a PMOS transistor or an NMOS transistor. The device layer may also include an interconnection structure electrically connected with the device structure, and an insulating layer surrounding the device structure and the interconnection structure.

In one embodiment, the device region C of the substrate structure 100 may also have a plurality of fin structures (not illustrated) discrete from each other, and a gate structure (not illustrated) on a surface of the fin structure. The fin structure may be extended along the first direction X or a second direction Y, and the second direction Y may be perpendicular to the first direction X.

In one embodiment, a first dielectric layer 110 may be formed over the device region C of the substrate structure 100. The first dielectric layer 110 may be configured to provide material for subsequently forming a dielectric layer. In one embodiment, forming the first dielectric layer 110 may include a thermal oxidation process, a deposition process, a spin coating process, or an epitaxial growth process. In one embodiment, the first dielectric layer 110 may be made of a material including silicon nitride, silicon oxide, silicon oxynitride, silicon oxycarbide, silicon carbonitride, or silicon oxy-carbo-nitride.

In one embodiment, the device region C of the substrate structure 100 may further include a fifth interconnection layer (not illustrated) and a sixth interconnection layer (not illustrated). The fifth interconnection layer may be electrically interconnected with a circuit of the device region C and a subsequently formed first interconnection layer, respectively. The sixth interconnection layer may be electrically interconnected with the circuit of the device region C and a subsequently formed second interconnection layer, respectively.

Figure 5:
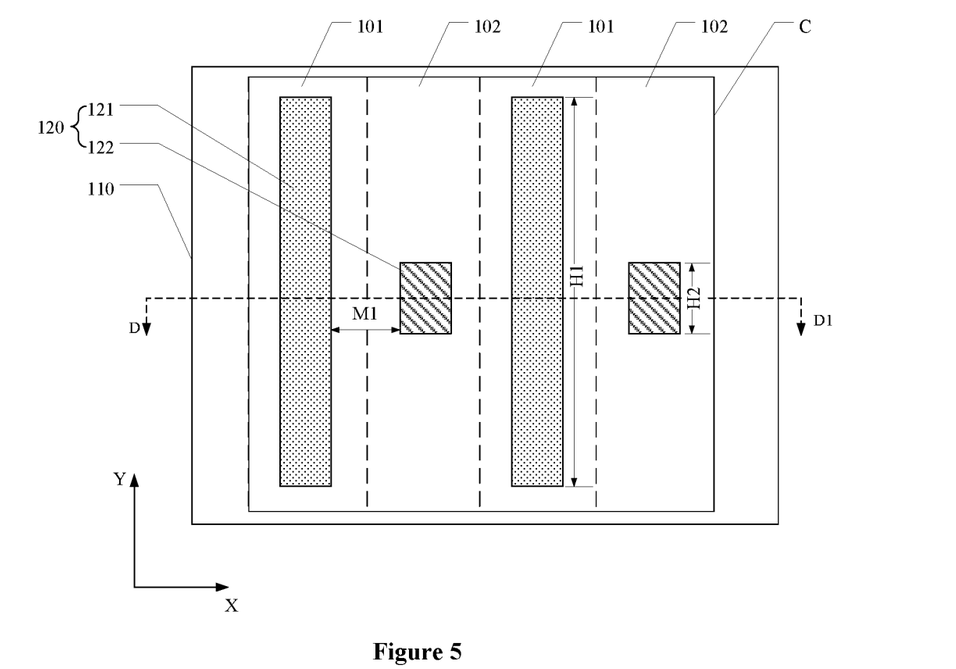
Figure 6:
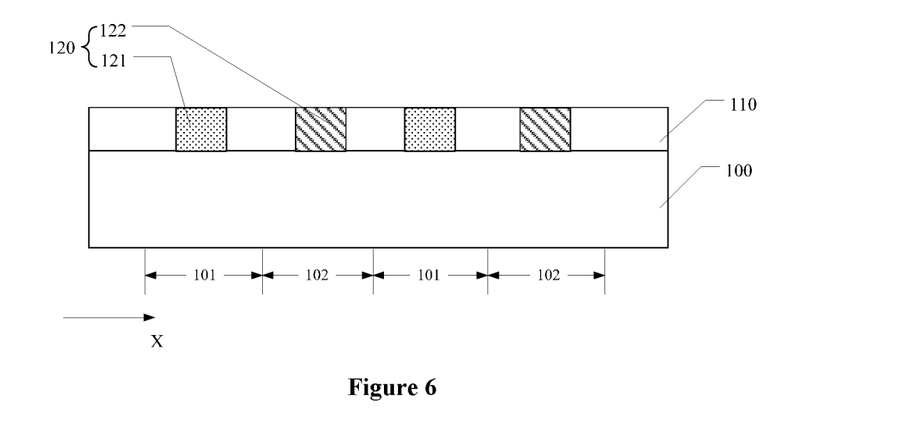

Returning to FIG. 11, after forming the first dielectric layer, a first interconnection structure may be formed (S102). FIGS. 5-6 illustrate a corresponding semiconductor structure.

FIG. 5 illustrates a schematic diagram of a semiconductor structure on the basis of FIG. 3, and FIG. 6 illustrates a schematic diagram of a semiconductor structure on the basis of FIG. 4. Referring to FIG. 5 and FIG. 6, a first interconnection structure 120 may be formed over the device region C, and the first interconnection structure 120 may be electrically interconnected with the circuit of the device region C. The first interconnection structure 120 may include a plurality of first interconnection layers 121 and a plurality of second interconnection layers 122 that are extended along the second direction Y. The first interconnection layer 121 may be formed over the first region 101, and the second interconnection layer 122 may be formed over the second region 102.

In one embodiment, one of the plurality of first interconnection layers 121 may be formed over one of the first regions 101, and one of the plurality of second interconnection layers 122 may be formed over one of the second regions 102.

In another embodiment, two or more of the plurality of first interconnection layers may be formed over one of the first regions, and one of the plurality of second interconnection layers may be formed over one of the second regions.

In certain embodiments, two or more of the plurality of first interconnection layers may be formed over one of the first regions, and two or more of the plurality of second interconnection layers may be formed over one of the second regions.

In one embodiment, in the second direction Y, a length of the first interconnection layer 121 may be greater than a length of the second interconnection layer 122. In one embodiment, in the second direction Y, the first interconnection layer 121 may have a first length H1, the second interconnection layer 122 may have a second length H2, where H1 may be greater than H2. In one embodiment, a minimum value of H2 may be approximately 100 nm. In one embodiment, in the first direction X, a minimum distance M1 between first interconnection layer 121 and the second interconnection layer 122 adjacent to the first interconnection layer 121 may be approximately 20 nm.

In one embodiment, forming the first interconnection structure 120 may include: forming a first patterned layer (not illustrated) on the surface of the first dielectric layer 110, where the first patterned layer may expose a portion of the surface of the first dielectric layer 110 over the first region 101 and the second region 102; using the first patterned layer as a mask, etching the first dielectric layer 110 until the surface of the substrate structure 100 is exposed, to form a first opening (not illustrated) in the first dielectric layer 110 over the first region 101 and a second opening (not illustrated) in the first dielectric layer 110 over the second region 102; after forming the first opening and the second opening, removing the first patterned layer; after removing the first patterned layer, forming a first interconnection structure material layer (not illustrated) in the first opening and the second opening and on the surface of the first dielectric layer 110; and back-etching the first interconnection structure material layer until the surface of the first dielectric layer 110 is exposed, to form a first interconnection layer 121 in the first opening and a second interconnection layer 122 in the second opening.

In one embodiment, etching the first dielectric layer 110 may include a wet etching process, or a dry etching process. In one embodiment, forming the first interconnection structure material layer may include an epitaxial growth process, or a deposition process. In one embodiment, back-etching the first interconnection structure material layer may include a wet etching process, or a dry etching process.

In one embodiment, the first interconnection structure material layer may be made of a material including a metal material, e.g., copper, aluminum, or titanium, etc. Therefore, the first interconnection layer 121 may be made of a same material as the second interconnection layer 122. The first interconnection layer 121 may be made of a material including a metal material, e.g., copper, aluminum, or titanium, etc. The second interconnection layer 122 may be made of a material including a metal material, e.g., copper, aluminum, or titanium, etc.

In another embodiment, the first interconnection layer and the second interconnection layer may be formed separately, and the first interconnection layer may be made of a material different from the second interconnection layer.

Figure 7:
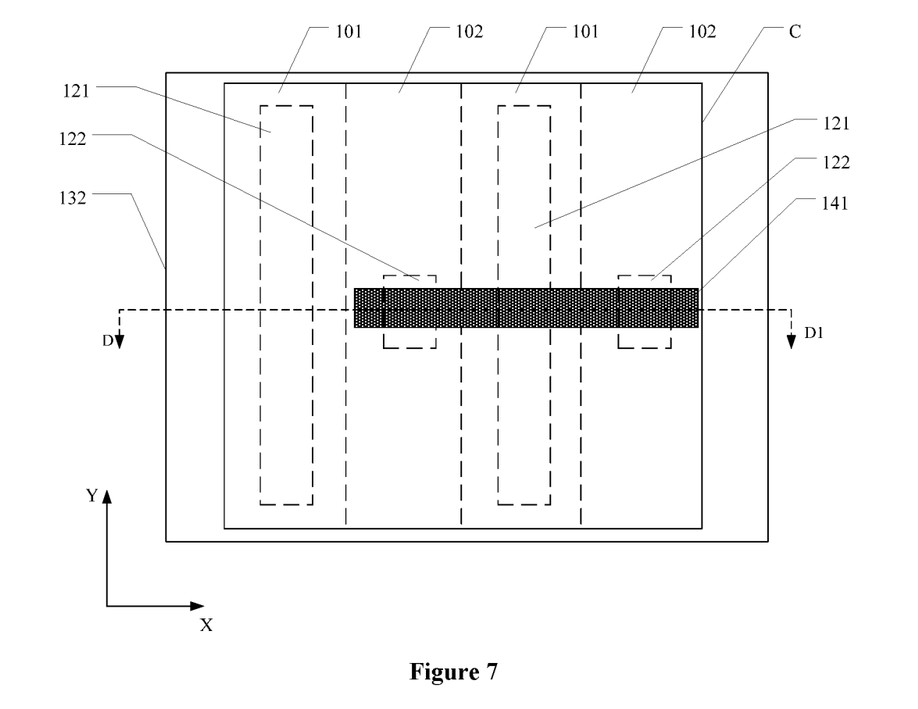
Figure 8:
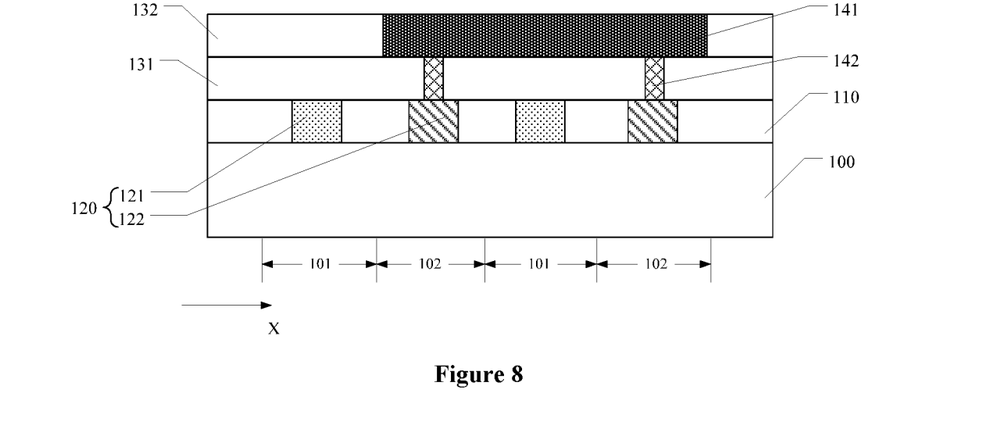

Returning to FIG. 11, after forming the first interconnection structure, a second dielectric layer may be formed on the surface of the first dielectric layer and the surface of the first interconnection structure, a plurality of first conductive plugs may be formed in the second dielectric layer, and a fourth interconnection layer may be formed over the first interconnection structure (S103). FIGS. 7-8 illustrate a corresponding semiconductor structure.

FIG. 7 illustrates a schematic diagram of a semiconductor structure on the basis of FIG. 5, and FIG. 8 illustrates a schematic diagram of a semiconductor structure on the basis of FIG. 6. Referring to FIG. 7 and FIG. 8, a fourth interconnection layer 141 may be formed over the first interconnection structure 120. The fourth interconnection layer 141 may be extended along the first direction X, and may be across all of the plurality of second interconnection layers 122. The fourth interconnection layer 141 may be electrically interconnected with the second interconnection layer 122 and a subsequently formed third interconnection layer, respectively.

It should be noted that for ease of understanding, the positions of the first interconnection layer 121 and the second interconnection layer 122 may be indicated by dotted lines in FIG. 7.

In one embodiment, before forming the fourth interconnection layer 141, a second dielectric layer 131 may be formed on the surface of the first dielectric layer 110 and the surface of the first interconnection structure 120. The second dielectric layer 131 may be configured to provide material for subsequently forming the dielectric layer. In one embodiment, forming the second dielectric layer 131 may include a thermal oxidation process, a deposition process, a spin coating process, or an epitaxial growth process.

In one embodiment, the second dielectric layer 131 may be made of a same material as the first dielectric layer 110. In certain embodiments, the second dielectric layer may be made of a material different from the first dielectric layer. In one embodiment, the second dielectric layer 131 may be made of a material including silicon nitride, silicon oxide, silicon oxynitride, silicon oxycarbide, silicon carbonitride, or silicon oxy-carbo-nitride.

In one embodiment, after forming the second dielectric layer 131 and before forming the fourth interconnection layer 141, a plurality of first conductive plugs 142 may be formed in the second dielectric layer 131. One or more first conductive plugs 142 may be formed on each of the second interconnection layers 122. The first conductive plug 142 may be electrically interconnected with the second interconnection layer 122 and the fourth interconnection layer 141, respectively.

In one embodiment, forming the first conductive plug 142 may include: forming a second patterned layer (not illustrated) on the surface of the second dielectric layer 131, where the second patterned layer may expose a portion of the surface of the second dielectric layer 131 over the second interconnection layer 122; using the second patterned layer as a mask, etching the second dielectric layer 131 until the surface of the second interconnection layer 122 is exposed, to form a first conductive plug opening (not illustrated); after forming the first conductive plug opening, removing the second patterned layer; and after removing the second patterned layer, forming the first conductive plug 142 in the first conductive plug opening, where the surface of the second dielectric layer 131 may expose the surface of the first conductive plug 142.

In one embodiment, the first conductive plug 142 may be made of a material including a metal material, e.g., copper, aluminum, or titanium, etc. In one embodiment, forming the first conductive plug 142 may include an epitaxial growth process, or a deposition process.

In one embodiment, after forming the first conductive plug 142 and before forming the fourth interconnection layer 141, a third dielectric layer 132 may be formed on the surface of the second dielectric layer 131 and the surface of the first conductive plug 142. The third dielectric layer 132 may be configured to provide material for subsequently forming a dielectric layer.

In one embodiment, forming the third dielectric layer 132 may include a thermal oxidation process, a deposition process, a spin coating process, or an epitaxial growth process. In one embodiment, the third dielectric layer 132 may be made of a same material as the first dielectric layer 110. In certain embodiments, the third dielectric layer may be made of a material different from the first dielectric layer. In one embodiment, the third dielectric layer 132 may be made of a material including silicon nitride, silicon oxide, silicon oxynitride, silicon oxycarbide, silicon carbonitride, or silicon oxy-carbo-nitride.

In one embodiment, forming the fourth interconnection layer 141 may include: forming a third patterned layer (not illustrated) on the surface of the third dielectric layer 132, where the third patterned layer may expose a portion of the surface of the third dielectric layer 132 over the second interconnection layer 122 and the first conductive plug 142; using the third patterned layer as a mask, etching the third dielectric layer 132 until the surface of the first conductive plug 142 is exposed, to form a fourth opening (not illustrated); after forming the fourth opening, removing the third patterned layer; and after removing the third patterned layer, forming a fourth interconnection layer 141 in the fourth opening.

In one embodiment, etching the third dielectric layer 132 may include a wet etching process, or a dry etching process. In one embodiment, forming the fourth interconnection layer 141 may include an epitaxial growth process, or a deposition process. In one embodiment, the fourth interconnection layer 141 may be made of a material including a metal material, e.g., copper, aluminum, or titanium, etc.

Returning to FIG. 11, after forming the fourth interconnection layer, a plurality of second conductive plugs may be formed in a fourth dielectric layer, and a plurality of third interconnection layers may be formed a plurality of third interconnection layers 151 may be formed over the first interconnection structure (S104). FIGS. 9-10 illustrate a corresponding semiconductor structure.

FIG. 9 illustrates a schematic diagram of a semiconductor structure on the basis of FIG. 7, and FIG. 10 illustrates a schematic diagram of a semiconductor structure on the basis of FIG. 8. Referring to FIG. 9 and FIG. 10, a plurality of third interconnection layers 151 may be formed over the first interconnection structure 120, and the third interconnection layer 151 may be formed over the second region 102. The third interconnection layer 151 may be electrically interconnected with the second interconnection layer 122. In the second direction Y, a length H3 of the third interconnection layer 151 may be greater than the length H2 of the second interconnection layer 122.

It should be noted that for ease of understanding, the positions of the first interconnection layer 121 and the second interconnection layer 122 may be indicated by dotted lines in FIG. 9.

Specifically, in the second direction Y, the third interconnection layer 151 may have a third length H3, and the third length H3 may be greater than the second length H2. In one embodiment, the third length H3 may be equal to the first length H1. In certain embodiments, the third length may be less than the first length and greater than the second length.

In one embodiment, in the direction perpendicular to a surface of the substrate structure, a minimum distance D1 between the top surface of the first interconnection structure 120 and the bottom surface of the third interconnection layer 151 may be in a range of approximately 400 nm-500 nm.

In one embodiment, a projection of the second interconnection layer 122 on the substrate structure 100 may be within a projection range of the third interconnection layer 151 on the substrate structure 100.

In one embodiment, after forming the fourth interconnection layer 141 and before forming the third interconnection layer 151, a fourth dielectric layer 161 may be formed on the surface of the third dielectric layer 132 and the surface of the fourth interconnection layer 141. The fourth interconnection layer 141 may be configured to provide a material for subsequently forming a dielectric layer.

In one embodiment, forming the fourth dielectric layer 161 may include a thermal oxidation process, a deposition process, a spin coating process, or an epitaxial growth process. In one embodiment, the fourth dielectric layer 161 may be made of a same material as the first dielectric layer 110. In certain embodiments, the fourth dielectric layer may be made of a material different from the first dielectric layer. In one embodiment, the fourth dielectric layer 161 may be made of a material including silicon nitride, silicon oxide, silicon oxynitride, silicon oxycarbide, silicon carbonitride, or silicon oxy-carbo-nitride.

In one embodiment, after forming the fourth dielectric layer 161 and before forming the third interconnection layer 151, a plurality of second conductive plugs 152 may be formed in the dielectric layer 161 over the fourth interconnection layer 141. The second conductive plug 152 may be electrically interconnected with the fourth interconnection layer 141 and the third interconnection layer 151, respectively.

In one embodiment, forming the second conductive plug 152 may include: forming a fourth patterned layer (not illustrated) on the surface of the fourth dielectric layer 161, where the fourth patterned layer may expose a portion of the surface of the fourth dielectric layer 161 over the fourth interconnection layer 141; using the fourth patterned layer as a mask, etching the fourth dielectric layer 161 until the surface of the fourth interconnection layer 141 is exposed, to form a second conductive plug opening (not illustrated); after forming the second conductive plug opening, removing the fourth patterned layer; and after removing the fourth patterned layer, forming the second conductive plug 152 in the second conductive plug opening, where the fourth dielectric layer 161 may expose the surface of the second conductive plug 152.

In one embodiment, the second conductive plug 152 may be made of a material including a metal material, e.g., copper, aluminum, titanium, or a combination thereof. In one embodiment, forming the second conductive plug 152 may include an epitaxial growth process, or a deposition process. In one embodiment, after forming the second conductive plug 152 and before forming the third interconnection layer 151, a fifth dielectric layer 162 may be formed on the surface of the fourth dielectric layer 161 and the surface of the second conductive plug 152.

The first dielectric layer 110, the second dielectric layer 131, the third dielectric layer 132, the fourth dielectric layer 161, and the fifth dielectric layer 162 may form a dielectric layer surrounding the first interconnection structure 120 and the third interconnection layer 151.

In one embodiment, forming the fifth dielectric layer 162 may include a thermal oxidation process, a deposition process, a spin coating process, or an epitaxial growth process. In one embodiment, the fifth dielectric layer 162 may be made of a same material as the first dielectric layer 110. In certain embodiments, the fifth dielectric layer may be made of a material different from the first dielectric layer. In one embodiment, the fifth dielectric layer 162 may be made of a material including silicon nitride, silicon oxide, silicon oxynitride, silicon oxycarbide, silicon carbonitride, or silicon oxycarbonitride.

In one embodiment, forming the third interconnection layer 151 may include: forming a fifth patterned layer (not illustrated) on the surface of the fifth dielectric layer 162, where the fifth patterned layer may expose the surface of the fifth dielectric layer 162 over the second interconnection layer 122 and the second conductive plug 152; using the fifth patterned layer as a mask, etching the fifth dielectric layer 162 until the surface of the second conductive plug 152 and the fourth dielectric layer 161 are exposed, to form a plurality of third openings (not illustrated); after forming the third openings, removing the fifth patterned layer; and after removing the fifth patterned layer, forming the third interconnection layer 151 in the third opening.

In one embodiment, etching the fifth dielectric layer 162 may include a wet etching process, or a dry etching process. In one embodiment, forming the third interconnection layer 151 may include an epitaxial growth process, or a deposition process. In one embodiment, the third interconnection layer 151 may be made of a material including a metal material, e.g., copper, aluminum, titanium, or a combination thereof.

Correspondingly, the present disclosure also provides a semiconductor structure formed by the above-disclosed method. Referring to FIG. 9 and FIG. 10, the semiconductor structure may include a substrate structure, and the substrate structure may include a device region C. The device region C may include a plurality of first regions 101, and a second region 102 disposed between adjacent first regions 101. The first region 101 and the second region 102 may be arranged along a first direction X. The semiconductor structure may also include a first interconnection structure 120 disposed over the device region C, and the first interconnection structure 120 may be electrically interconnected with a circuit of the device region C.

The first interconnection structure 120 may include a plurality of first interconnection layers 121 and a plurality of second interconnection layers 122 that are extended along a second direction Y. The first interconnection layer 121 may be formed over the first region 101, and the second interconnection layer 122 may be formed over the second region 102. The first direction X may be perpendicular to the second direction Y. In the second direction Y, a length H1 of the first interconnection layer 121 may be greater than a length H2 of the second interconnection layer 122. Further, the semiconductor structure may include a plurality of third interconnection layers 151 formed over the first interconnection structure 120, and the third interconnection layer 151 may be formed over the second region 102. The third interconnection layer 151 may be electrically interconnected with the second interconnection layer 122. In the second direction Y, a length H3 of the third interconnection layer 151 may be greater than the length H2 of the second interconnection layer 122.

Through the first interconnection structure 120 and the third interconnection layer 151, the parasitic capacitance between the first interconnection layer 121 and the second interconnection layer 122 may be reduced, the parasitic capacitance generated between first interconnection layers 121 formed over the adjacent first regions 101 may be reduced, and the parasitic capacitance between the third interconnection layer 151 and the first interconnection layer 121 may be reduced.

First, the first interconnection layer 121 may be formed over the first region 101, the second interconnection layer 122 may be formed over the second region 102, and the length of the first interconnection layer 121 may be greater than the length of the second interconnection layer 122. Thus, in the first direction X, through the second interconnection layer 122 with a substantially small length, the overlapped portion between the second interconnection layer 122 and the first interconnection layer 121 may be substantially small. Therefore, the parasitic capacitance between the adjacent first interconnection layer 121 and the second interconnection layer 122 may be reduced, thereby reducing the RC delay.

Second, the first interconnection layer 121 may be formed over the first region 101, and the second region 102 may be disposed between adjacent first regions 101. The spacing between the first interconnection layers formed over the adjacent first regions 101 may increase, and, thus, the parasitic capacitance generated between the first interconnection layers 121 formed over the adjacent first regions 101 may be reduced, thereby reducing the RC delay.

Third, the third interconnection layer 151 electrically interconnected with the second interconnection layer 122 may be disposed over the second region 102, the spacing between the third interconnection layer 151 and the first interconnection layer 121 may increase, therefore, the parasitic capacitance between the third interconnection layer 151 and the first interconnection layer 121 may be reduced, thereby reducing the RC delay.

Accordingly, through the first interconnection structure 120 and the third interconnection layer 151, the parasitic capacitance between the electrical interconnection layers in the semiconductor structure may be reduced, and the RC delay may be reduced, thereby improving the performance of the semiconductor structure.

The substrate structure 100 may be made of a semiconductor material. In one embodiment, the substrate structure 100 may be made of silicon. In another embodiment, the substrate structure may be made of a material including silicon carbide, silicon germanium, a multi-element semiconductor material composed of group III-V elements, silicon-on-insulator (SOI), or germanium-on-insulator. The multi-element semiconductor material composed of group III-V elements may include InP, GaAs, GaP, InAs, InSb, InGaAs or InGaAsP.

In one embodiment, the device region C of the substrate structure 100 may have a device layer (not illustrated). The device layer may include a device structure, e.g., a PMOS transistor or an NMOS transistor. The device layer may also include an interconnection structure electrically connected to the device structure, and an insulating layer surrounding the device structure and the interconnection structure.

In one embodiment, the device region C of the substrate structure 100 may also have a plurality of fin structures (not illustrated) discrete from each other, and a gate structure (not illustrated) formed on a surface of the fin structure. The fin structure may be extended along the first direction X or a second direction Y, and the second direction Y may be perpendicular to the first direction X.

In one embodiment, the device region C of the substrate structure 100 may further include a fifth interconnection layer (not illustrated) and a sixth interconnection layer (not illustrated). The fifth interconnection layer may be electrically interconnected with a circuit of the device region C and the subsequently formed first interconnection layer, respectively. The sixth interconnection layer may be electrically interconnected with the circuit of the device region C and the subsequently formed second interconnection layer, respectively.

In one embodiment, in the second direction Y, the first interconnection layer 121 may have a first length H1, the second interconnection layer 122 may have a second length H2, and the third interconnection layer 151 may have a third length H3, where the first length H1 may be greater than the second length H2, and the third length H3 may be greater than the second length H2.

In one embodiment, a minimum value of H2 may be approximately 100 nm. In one embodiment, the third length H3 may be equal to the first length H1. In another embodiment, the third length may be greater than the second length and smaller than the first length. In one embodiment, in the first direction X, a minimum distance M1 between first interconnection layer 121 and the second interconnection layer 122 adjacent to the first interconnection layer 121 may be approximately 20 nm.

In one embodiment, in a direction perpendicular to a surface of the substrate structure, a minimum distance D1 between a top surface of the first interconnection structure 120 and a bottom surface of the third interconnection layer 151 may be in a range of approximately 400 nm-500 nm.

If the minimum distance D1 is too small, the minimum spacing between the first interconnection layer 121 and the third interconnection layer 151 may be too small, which may not effectively reduce the parasitic capacitance between the first interconnection layer 121 and the third interconnection layer 151. If the minimum distance D1 is too large, an aspect ratio of the conductive plug located between the second interconnection layer 122 and the third interconnection layer 151 may be substantially large, which may reduce the process windows of etching, deposition, and epitaxy, etc., for forming the conductive plug, and make it difficult to form a conductive plug with a desired morphology. Therefore, the minimum distance D1 selected from a suitable range may facilitate to reduce the parasitic capacitance while forming the conductive plug with a desired morphology between the second interconnection layer 122 and the third interconnection layer 151.

In one embodiment, a projection of the second interconnection layer 122 on the substrate structure 100 may be located within a projection range of the third interconnection layer 151 on the substrate structure 100.

In one embodiment, the semiconductor structure may further include a first dielectric layer 110 formed over the device region C of the substrate structure 100. In one embodiment, the first dielectric layer 110 may be made of a material including silicon nitride, silicon oxide, silicon oxynitride, silicon oxycarbide, silicon carbonitride, or silicon oxy-carbo-nitride.

In one embodiment, the first interconnection layer 121 may be formed in the first dielectric layer 110 over the first region 101, and the second interconnection layer may be formed in the first dielectric layer 110 over the second region 102.

In one embodiment, one of the plurality of first interconnection layers 121 may be formed over one of the first regions 101, and one of the plurality of second interconnection layers 122 may be formed over one of the second regions 102.

In another embodiment, two or more of the plurality of first interconnection layers may be formed over one of the first regions, and one of the plurality of second interconnection layers may be formed over one of the second regions.

In certain embodiments, two or more of the plurality of first interconnection layers may be formed over one of the first regions, and two or more of the plurality of second interconnection layers may be formed over one of the second regions.

In one embodiment, the first interconnection layer 121 may be made of a material including a metal material, e.g., copper, aluminum, or titanium, etc. In one embodiment, the second interconnection layer 122 may be made of a material including a metal material, e.g., copper, aluminum, or titanium, etc. In one embodiment, the third interconnection layer 151 may be made of a material including a metal material, e.g., copper, aluminum, or titanium, etc.

In one embodiment, the semiconductor structure may further include: a second dielectric layer 131 formed on the surface of the first dielectric layer 110 and the surface of the first interconnection structure 120; a plurality of first conductive plugs 142 formed in the second dielectric layer 131; a third dielectric layer 132 formed on the surface of the second dielectric layer 131 and the surface of the first conductive plug 142; and a fourth interconnection layer 141 formed in the third dielectric layer 132. The fourth interconnection layer 141 may be formed between the second interconnection layer 122 and the third interconnection layer 151. The fourth interconnection layer 141 may be extended along the first direction X, and may be across all of the plurality of second interconnection layers 122. The fourth interconnection layer 141 may be electrically interconnected with the second interconnection layer 122 and the third interconnection layer 151, respectively.

Because the fourth interconnection layer 141 is located between the second interconnection layer 122 and the third interconnection layer 151, the aspect ratio of the conductive plug between the second interconnection layer 122 and the third interconnection layer 151 for electrical interconnection may be reduced. Therefore, the process windows of the deposition, etching and epitaxy, etc., for forming the conductive plug (the first conductive plug 142 and the second conductive plug 152) may increase, and the conductive plug with desired morphology and quality may be formed.

In one embodiment, one first conductive plug 142 may be located between the fourth interconnection layer 141 and one of the second interconnection layers 122, and the one first conductive plug 142 may be electrically interconnected with the fourth interconnection layer 141 and the one second interconnection layer 122, respectively. Thus, the electrical interconnection between the fourth interconnection layer 141 and the second interconnection layer 122 may be achieved.

In one embodiment, the fourth interconnection layer 141 may be made of a material including a metal material, e.g., copper, aluminum, or titanium, etc. In one embodiment, the first conductive plug 142 may be made of a material including a metal material, e.g., copper, aluminum, or titanium, etc.

In one embodiment, the second dielectric layer 131 may be made of a same material as the first dielectric layer 110, and the third dielectric layer 132 may be made of a same material as the first dielectric layer 110. In certain embodiments, the second dielectric layer may be made of a material different from the first dielectric layer, and the third dielectric layer may be made of a material different from the first dielectric layer. In one embodiment, the second dielectric layer 131 may be made of a material including silicon nitride, silicon oxide, silicon oxynitride, silicon oxycarbide, silicon carbonitride, or silicon oxy-carbo-nitride. In one embodiment, the third dielectric layer 132 may be made of a material including silicon nitride, silicon oxide, silicon oxynitride, silicon oxycarbide, silicon carbonitride, or silicon oxy-carbo-nitride.

In one embodiment, the semiconductor structure may further include: a fourth dielectric layer 161 formed on the surface of the third dielectric layer 132 and the surface of the fourth interconnection layer 141; a plurality of second conductive plugs 152 formed in the dielectric layer 161 over the fourth interconnection layer 141; and a fifth dielectric layer 162 formed on the surface of the fourth dielectric layer 161 and the surface of the second conductive plug 152. The third interconnection layer 151 may be formed in the fifth dielectric layer 162.

The first dielectric layer 110, the second dielectric layer 131, the third dielectric layer 132, the fourth dielectric layer 161, and the fifth dielectric layer 162 may form a dielectric layer surrounding the first interconnection structure 120 and the third interconnection layer 151.

In one embodiment, one second conductive plug 152 may be located between the fourth interconnection layer 141 and one of the third interconnection layers 151, and the one second conductive plug 152 may be electrically interconnected with the fourth interconnection layer 141 and the one third interconnection layer 151, respectively. Thus, the electrical interconnection between the fourth interconnection layer 141 and the third interconnection layer 151 may be achieved.

In one embodiment, the second conductive plug 152 may be made of a material including a metal material, e.g., copper, aluminum, or titanium, etc.

In one embodiment, the fourth dielectric layer 161 may be made of a same material as the first dielectric layer 110, and the fifth dielectric layer 162 may be made of a same material as the first dielectric layer 110. In certain embodiments, the fourth dielectric layer may be made of a material different from the first dielectric layer, and the fifth dielectric layer may be made of a material different from the first dielectric layer. In one embodiment, the fourth dielectric layer 161 may be made of a material including silicon nitride, silicon oxide, silicon oxynitride, silicon oxycarbide, silicon carbonitride, or silicon oxy-carbo-nitride. In one embodiment, the fifth dielectric layer 162 may be made of a material including silicon nitride, silicon oxide, silicon oxynitride, silicon oxycarbide, silicon carbonitride, or silicon oxy-carbo-nitride.

The disclosed embodiments may have following beneficial effects. In the disclosed embodiments of the present disclosure, through the first interconnection structure and the third interconnection layer, the parasitic capacitance between the first interconnection layer and the second interconnection layer may be reduced, the parasitic capacitance generated between first interconnection layers formed over the adjacent first regions may be reduced, and the parasitic capacitance between the third interconnection layer and the first interconnection layer may be reduced.

First, the first interconnection layer may be formed over the first region, the second interconnection layer may be formed over the second region, and the length of the first interconnection layer may be greater than the length of the second interconnection layer. Thus, in the first direction, through the second interconnection layer with a substantially small length, the overlapped portion between the second interconnection layer and the first interconnection layer may be substantially small. Therefore, the parasitic capacitance between the adjacent first interconnection layer and the second interconnection layer may be reduced, thereby reducing the RC delay.

Second, the first interconnection layer may be formed over the first region, the second region may be disposed between adjacent first regions, and the spacing between the first interconnection layers formed over the adjacent first regions may increase. Therefore, the parasitic capacitance generated between the first interconnection layers formed over the adjacent first regions may be reduced, thereby reducing the RC delay.

Third, the third interconnection layer electrically interconnected with the second interconnection layer may be formed over the second region, and the spacing between the third interconnection layer and the first interconnection layer may increase. Therefore, the parasitic capacitance between the third interconnection layer and the first interconnection layer may be reduced, thereby reducing the RC delay.

Accordingly, through the first interconnection structure and the third interconnection layer, the parasitic capacitance between the electrical interconnection layers in the semiconductor structure may be reduced, and the RC delay may be reduced, thereby improving the performance of the semiconductor structure.

The above detailed descriptions only illustrate certain exemplary embodiments of the present disclosure, and are not intended to limit the scope of the present disclosure. Those skilled in the art can understand the specification as whole and technical features in the various embodiments can be combined into other embodiments understandable to those persons of ordinary skill in the art. Any equivalent or modification thereof, without departing from the spirit and principle of the present disclosure, falls within the true scope of the present disclosure.

What is claimed is:
1. A semiconductor structure, comprising:
a substrate structure, including a device region, wherein the device region includes a plurality of first regions and one or more second regions, a second region of the one or more second regions is disposed between adjacent first regions of the plurality of first regions, and the plurality of first regions and the one or more second regions are arranged along a first direction;
a first interconnection structure, disposed over the device region and electrically interconnected with a circuit of the device region, wherein the first interconnection structure includes a plurality of first interconnection layers and a plurality of second interconnection layers that are extended along a second direction, a first interconnection layer of the plurality of first interconnection layers is disposed over a first region of the plurality of first regions, a second interconnection layer of the plurality of second interconnection layers is disposed over the second region, a length of the first interconnection layer in the second direction is greater than a length of the second interconnection layer in the second direction, the first direction is perpendicular to the second direction, and the first interconnection layer and the second interconnection layer are both symmetrical with respect to a midline of the substrate structure in the second direction;
a plurality of third interconnection layers, disposed over the first interconnection structure, wherein a third interconnection layer of the plurality of third interconnection layers is disposed over the second region, the third interconnection layer is electrically interconnected with the second interconnection layer, and the third interconnection layer has a length greater than the second interconnection layer in the second direction;

a fourth interconnection layer, disposed between the second interconnection layer and the third interconnection layer, wherein the fourth interconnection layer is a single structure that is extended along the first direction and is across all of the plurality of second interconnection layers, and the fourth interconnection layer is electrically interconnected with the second interconnection layer and the third interconnection layer, respectively, the fourth interconnection layer being symmetrical with respect to the midline of the substrate structure in the second direction, a length of the fourth interconnection layer in the first direction being greater than a length of the second interconnection layer in the first direction, and a length of the fourth interconnection layer in the second direction being less than the length of the second interconnection layer in the second direction.

2. The semiconductor structure according to claim 1, wherein:
in the second direction, a minimum length of the second interconnection layer is approximately 100 nm.

3. The semiconductor structure according to claim 1, wherein:
in the second direction, the third interconnection layer has a length equal to the first interconnection layer.

4. The semiconductor structure according to claim 1, wherein:
in a direction perpendicular to a surface of the substrate structure, a minimum distance between a top surface of the first interconnection structure and a bottom surface of the third interconnection layer is in a range of approximately 400 nm-500 nm.

5. The semiconductor structure according to claim 1, wherein:
one of the plurality of first interconnection layers is disposed over one of the plurality of first regions, and one of the plurality of second interconnection layers is disposed over one of the one or more second regions.

6. The semiconductor structure according to claim 5, wherein:
in the first direction, a minimum distance between a first interconnection layer and a second interconnection layer adjacent to the first interconnection layer is approximately 20 nm.

7. The semiconductor structure according to claim 1, wherein:
two or more of the plurality of first interconnection layers are disposed over one of the plurality of first regions, and one of the plurality of second interconnection layers is disposed over one of the one or more second regions.

8. The semiconductor structure according to claim 1, wherein:
two or more of the plurality of first interconnection layers are disposed over one of the plurality of first regions, and two or more of the plurality of second interconnection layers are disposed over one of the one or more second regions.

9. The semiconductor structure according to claim 1, further including:
a plurality of first conductive plugs, wherein one of the plurality of first conductive plugs is disposed between the fourth interconnection layer and one of the plurality of second interconnection layers, and the one first conductive plug is electrically interconnected with the fourth interconnection layer and the one second interconnection layer, respectively.

10. The semiconductor structure according to claim 9, further including:
a plurality of second conductive plugs, wherein each of the plurality of second conductive plugs is disposed between the fourth interconnection layer and one of the plurality of third interconnection layers, and the each second conductive plug is electrically interconnected with the fourth interconnection layer and the one third interconnection layer, respectively.

11. The semiconductor structure according to claim 10, further including:
a dielectric layer surrounding the first interconnection structure, the plurality of first conductive plugs, the plurality of second conductive plugs, the fourth interconnection layer, and the third interconnection layer.

12. The semiconductor structure according to claim 11, wherein:
the dielectric layer is made of a material including silicon nitride, silicon oxide, silicon oxynitride, silicon oxycarbide, silicon carbonitride, silicon oxy-carbo-nitride, or a combination thereof.

13. The semiconductor structure according to claim 1, wherein:
the first interconnection layer is made of a material including a metal material;
the second interconnection layer is made of a material including a metal material; and
the third interconnection layer is made of a material including a metal material.

14. The semiconductor structure according to claim 1, wherein:
the device region of the substrate structure further includes a plurality of fin structures discrete from each other, and a gate structure on a surface of a fin structure of the plurality of fin structures, wherein the fin structure is extended along the first direction or the second direction.

15. The semiconductor structure according to claim 1, wherein:
a minimum length of the second interconnection layer in the second direction is greater than a minimum distance between the first interconnection layer and the second interconnection layer adjacent to the first interconnection layer in the first direction.

16. A method for forming a semiconductor structure, comprising:
providing a substrate structure, wherein the substrate structure includes a device region, the device region includes a plurality of first regions and one or more second regions, a second region of the one or more second regions is disposed between adjacent first regions of the plurality of first regions, and the plurality of first regions and the one or more second regions are arranged along a first direction;
forming a first interconnection structure over the device region, wherein the first interconnection structure is electrically interconnected with a circuit of the device region, the first interconnection structure includes a plurality of first interconnection layers and a plurality of second interconnection layers that are extended along a second direction, a first interconnection layer of the plurality of first interconnection layers is disposed over a first region of the plurality of first regions, a second interconnection layer of the plurality of second interconnection layers is disposed over the second region, a length of the first interconnection layer in the second direction is greater than a length of the second interconnection layer in the second direction, the first direction is perpendicular to the second direction, and the first interconnection layer and the second interconnection layer are both symmetrical with respect to a midline of the substrate structure in the second direction;

forming a plurality of third interconnection layers over the first interconnection structure, wherein a third interconnection layer of the plurality of third interconnection layers is disposed over the second region, the third interconnection layer is electrically interconnected with the second interconnection layer, and the third interconnection layer has a length greater than the second interconnection layer in the second direction;

before forming the plurality of third interconnection layers, forming a fourth interconnection layer between the second interconnection layer and the third interconnection layer, wherein the fourth interconnection layer is a single structure that is extended along the first direction and is across all of the plurality of second interconnection layers, and the fourth interconnection layer is electrically interconnected with the second interconnection layer and the third interconnection layer, respectively, the fourth interconnection layer being symmetrical with respect to the midline of the substrate structure in the second direction, a length of the fourth interconnection layer in the first direction being greater than a length of the second interconnection layer in the first direction, and a length of the fourth interconnection layer in the second direction being less than the length of the of the second interconnection layer in the second direction.

17. The method according to claim 16, further including:

forming a plurality of first conductive plugs, wherein one of the plurality of first conductive plugs is disposed between the fourth interconnection layer and one of the plurality of second interconnection layers, and the one first conductive plug is electrically interconnected with the fourth interconnection layer and the one second interconnection layer, respectively; and forming a plurality of second conductive plugs, wherein one of the plurality of second conductive plugs is disposed between the fourth interconnection layer and one of the plurality of third interconnection layers, and the one second conductive plug is electrically interconnected with the fourth interconnection layer and the one third interconnection layer, respectively.

18. The method according to claim 17, further including:

forming a dielectric layer surrounding the first interconnection structure, the plurality of first conductive plugs, the plurality of second conductive plugs, the fourth interconnection layer, and the third interconnection layer.

\* \* \* \* \*